United States Patent
Salmon et al.

(10) Patent No.: US 10,160,637 B2
(45) Date of Patent: Dec. 25, 2018

(54) MOLDED LEAD FRAME PACKAGE WITH EMBEDDED DIE

(71) Applicant: Robert Bosch GmbH, Stuttgart (DE)

(72) Inventors: Jay Scott Salmon, Pittsburgh, PA (US); Uwe Hansen, Tubingen (DE)

(73) Assignee: Robert Bosch GmbH, Stuttgart (DE)

( * ) Notice: Subject to any disclaimer, the term of this patent is extended or adjusted under 35 U.S.C. 154(b) by 216 days.

(21) Appl. No.: 14/915,032

(22) PCT Filed: Aug. 29, 2014

(86) PCT No.: PCT/US2014/053335
§ 371 (c)(1),
(2) Date: Feb. 26, 2016

(87) PCT Pub. No.: WO2015/031711
PCT Pub. Date: Mar. 5, 2015

(65) Prior Publication Data
US 2016/0207759 A1 Jul. 21, 2016

Related U.S. Application Data

(60) Provisional application No. 61/871,366, filed on Aug. 29, 2013.

(51) Int. Cl.
*H01L 29/82* (2006.01)
*B81B 7/00* (2006.01)
(Continued)

(52) U.S. Cl.
CPC .......... *B81B 7/007* (2013.01); *B81C 1/00238* (2013.01); *H01L 21/4828* (2013.01);
(Continued)

(58) Field of Classification Search
CPC ............... B81B 7/007; B81C 1/00238; H01L 23/495–53/49596; H01L 23/49861;
(Continued)

(56) References Cited

U.S. PATENT DOCUMENTS 7,154,186 B2   12/2006  Noquil et al.
7,763,488 B2    7/2010  Goodelle et al.
(Continued)

FOREIGN PATENT DOCUMENTS

WO   2007/022179   2/2007
WO   2011/103720   9/2011
WO   2013/065895   5/2013

OTHER PUBLICATIONS

International Search Report and Written Opinion for Application No. PCT/US2014/053335 dated Jan. 20, 2015 (11 pages).

*Primary Examiner* — Kevin M Picardat
(74) *Attorney, Agent, or Firm* — Michael Best & Friedrich LLP

(57) ABSTRACT

A semiconductor package. The semiconductor package includes a first side, a second side, a molded substrate, a die, and a lead frame. The second side of the semiconductor package is opposite the first side of the semiconductor package. The die and lead frame are embedded into the molded substrate. The lead frame is also positioned between the first side and the second side of the semiconductor package to provide a first electrical connection between the first side and the second side of the semiconductor package.

12 Claims, 11 Drawing Sheets

(51) Int. Cl.
| | |
|---|---|
| *H01L 23/498* | (2006.01) |
| *H04R 19/00* | (2006.01) |
| *H04R 19/04* | (2006.01) |
| *H04R 31/00* | (2006.01) |
| *B81C 1/00* | (2006.01) |
| *H01L 21/48* | (2006.01) |
| *H01L 23/495* | (2006.01) |

(52) U.S. Cl.
CPC .. *H01L 23/49541* (2013.01); *H01L 23/49861* (2013.01); *H04R 19/005* (2013.01); *H04R 19/04* (2013.01); *H04R 31/00* (2013.01); *B81B 2201/0257* (2013.01); *B81B 2207/012* (2013.01); *B81B 2207/07* (2013.01); *H01L 2224/48091* (2013.01); *H01L 2924/19107* (2013.01); *H04R 2201/003* (2013.01)

(58) Field of Classification Search
CPC .. H01L 23/48; H01L 21/4821–21/4842; H01L 25/041; H01L 25/065; H01L 25/07; H01L 25/165; H01L 21/4817; H01L 2225/1064
USPC .......................... 438/111, 112, 123; 257/416
See application file for complete search history.

(56) References Cited

U.S. PATENT DOCUMENTS

| | | | |
|---|---|---|---|
| 7,795,078 | B2 | 9/2010 | Ramakrishna et al. |
| 8,030,770 | B1 | 10/2011 | Juskey et al. |
| 8,169,058 | B2 | 5/2012 | Pagaila et al. |
| 8,513,787 | B2 | 8/2013 | Williams et al. |
| 8,541,851 | B2 | 9/2013 | Ly et al. |
| 2010/0044842 | A1 | 2/2010 | Mengel et al. |
| 2011/0111562 | A1* | 5/2011 | San Antonio ....... H01L 21/4832 438/113 |
| 2011/0278707 | A1* | 11/2011 | Chi ..................... H01L 21/4832 257/676 |
| 2012/0087521 | A1 | 4/2012 | Delaus et al. |
| 2013/0043574 | A1 | 2/2013 | Williams et al. |
| 2013/0193533 | A1 | 8/2013 | Vos et al. |
| 2014/0306330 | A1* | 10/2014 | Williams .......... H01L 23/49541 257/675 |

* cited by examiner

MOLDED LEAD FRAME PACKAGE WITH EMBEDDED DIE

RELATED APPLICATIONS

This patent application claims priority from provisional U.S. Patent Application No. 61/871,366 filed Aug. 29, 2013, entitled, "MOLDED LEAD FRAME PACKAGE WITH EMBEDDED DIE," the disclosure of which is incorporated herein, in its entirety, by reference.

BACKGROUND

The present invention relates to methods for creating a semiconductor package substrate. In solid-state electronics, a semiconductor package substrate is a mechanical carrier used to make electrical connections between a semiconductor die and other circuits. A semiconductor die is a thin slice of material such as silicon or gallium arsenide which serves as the foundation upon which electronic devices such as transistors, diodes, and integrated circuits are deposited. In some implementations, semiconductor substrates are constructed by embedding metal lead frames in plastic. In other implementations, semiconductor substrates are constructed by patterning layers of copper bonded to organic films. Semiconductor die are bonded to the semiconductor package substrates to form electrical connections between multiple semiconductor die and other passive circuits.

SUMMARY

The invention provides a method for creating a molded package substrate that incorporates both an embedded die and lead frame structure into a single substrate. The substrate concept is suitable for both microphone and non-microphone packages in chip and wire or flip chip configuration.

The invention also provides a molded package substrate design that incorporates several key design requirements. The design requirements include a low cost embedding of a die into a semiconductor substrate, high density interconnect connections between ally two semiconductor die, a low thermal resistance path for two stacked die in a single package, and dual side half etching of a lead frame that creates an isolated port hole and seal ring that is compatible with standard surface mount device processes used to assemble such devices.

The invention further provides a semiconductor package. The semiconductor package includes a first side, a second side, a molded substrate, a die, and a lead frame. The second side of the semiconductor package is opposite the first side of the semiconductor package. The die and lead frame are embedded into the molded substrate. The die includes a first electrical contact surface that is positioned on a first side of the die. The lead frame is also positioned between the first side and the second side of the semiconductor package to provide a first electrical connection between the first side and the second side of the semiconductor package.

The invention additionally provides a method of manufacturing a semiconductor package. The semiconductor package including a first side and a second side. The second side of the semiconductor package is opposite the first side of the semiconductor package. The method includes providing a molded substrate, embedding a die into the molded substrate, and embedding a lead frame into the molded substrate. The die includes a first electrical contact surface that is positioned on a first side of the die. The lead frame is positioned to between the first side and the second side of the semiconductor package to provide a first electrical connection between the first side and the second side of the semiconductor package.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out hi various ways.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

Figure 1A:
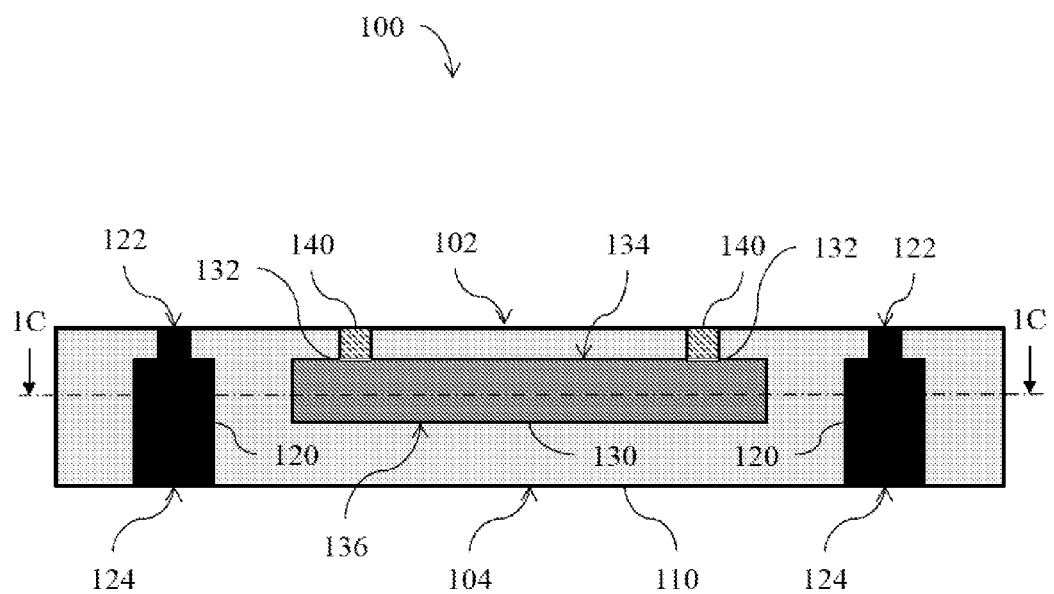
FIG. 1A illustrates a cross-section side view of a semiconductor package.
Figure 1B:
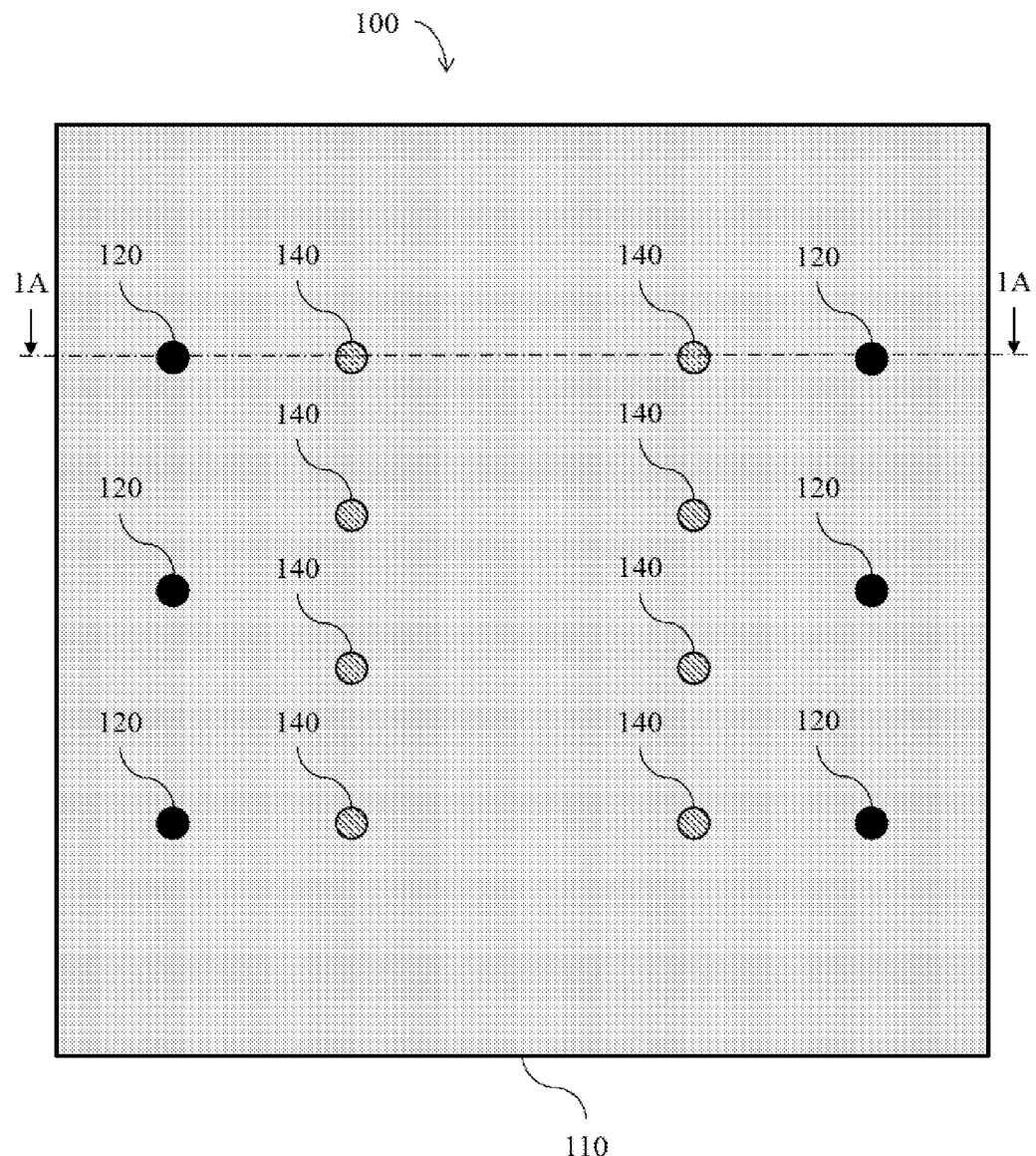
FIG. 1B illustrates a top view of the semiconductor package in FIG. 1A.
Figure 1C:
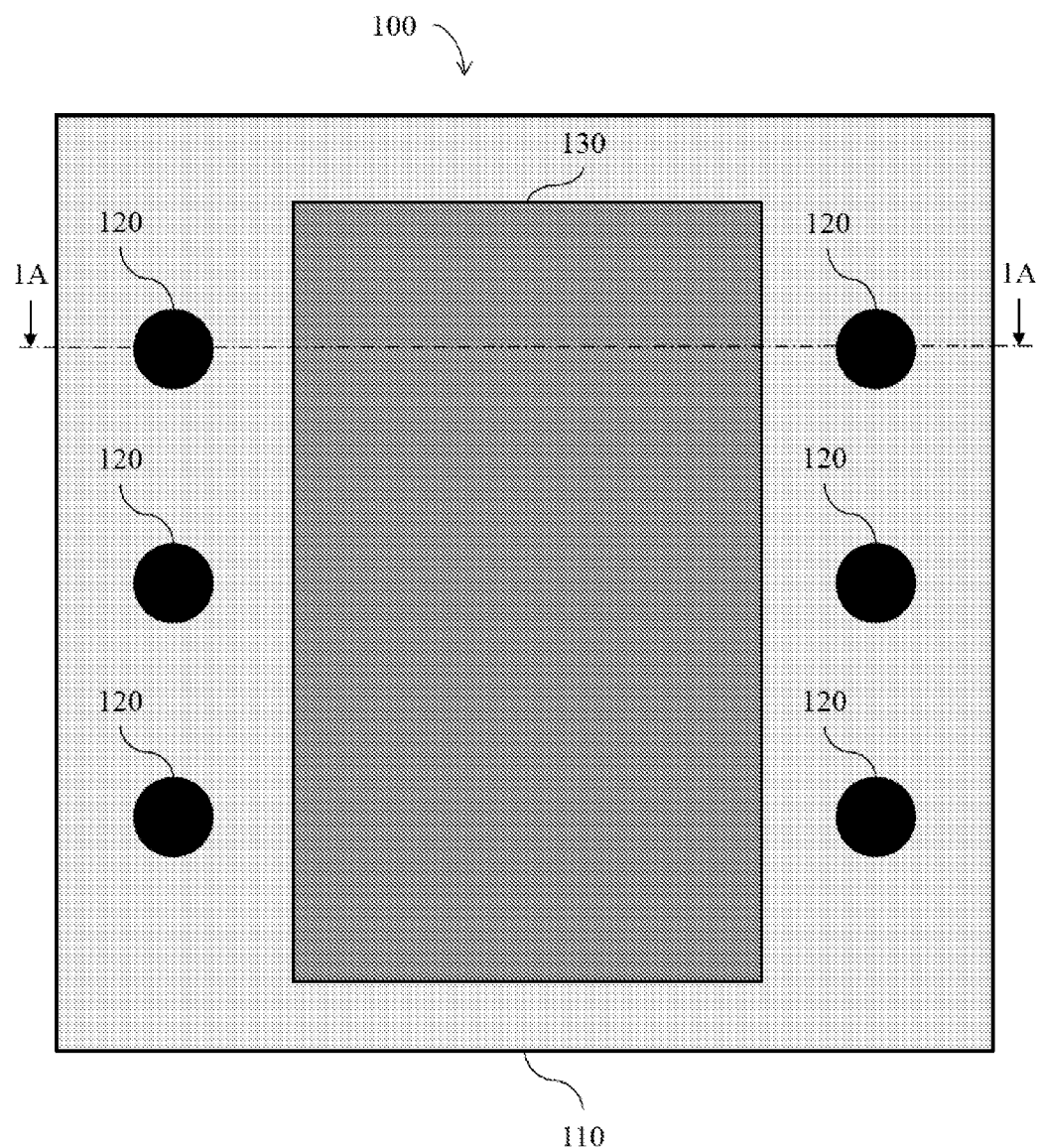
FIG. 1C illustrates a cross-section top view of the semiconductor package in FIG. 1A.

In some implementations, a semiconductor package 100 includes, among other components, a first side 102, a second side 104, a molded substrate 110, a lead frame 120 having a first side 122 and a second side 124, an embedded die 130, and a first plurality of pillar bumps 140, as illustrated in FIGS. 1A-1C. The first side 102 of the semiconductor package 100 is opposite from the second side 104 of the semiconductor package 100.

The embedded die 130 is embedded in the molded substrate 110. In some implementations, the embedded die 130 is an application specific integrated circuit. In some implementations, the embedded die 130 is a silicon die. The embedded die 130 includes a plurality of exposed electrical contact (i.e., connection) surfaces 132 that is positioned on a first side 134 of the embedded die 130. In some implementations, the embedded die 130 further includes a second plurality of exposed electrical contact surfaces (not shown) that is positioned on a second side 136 of the embedded die 130. The second side 136 of the embedded the 130 is opposite from the first side 134 of the embedded die 130.

The lead frame 120 is also embedded in the molded substrate 110. The first side of the lead frame 122 is half etched. The lead frame 120 provides electrical connections between the first side 102 and the second side 104 of the semiconductor package 100. The thermal and stress characteristics of the electrical connections formed by the lead frame 120 vary based at least in part on the size and material of the lead frame 120.

The first plurality of pillar bumps 140 provides electrical connections between the first side of the semiconductor package 102 and the first side 134 of the embedded die 130. The thermal and stress characteristics of the electrical connections formed by the plurality of pillar bumps 140 vary based at least in part on the size, material, and quantity of the plurality of pillar bumps 140. In some implementations, the plurality of pillar bumps 140 is made of copper. In some implementations, the plurality of pillar bumps 140 is made of gold, platinum, or any other electroplated metal known in the art.

Figure 2:
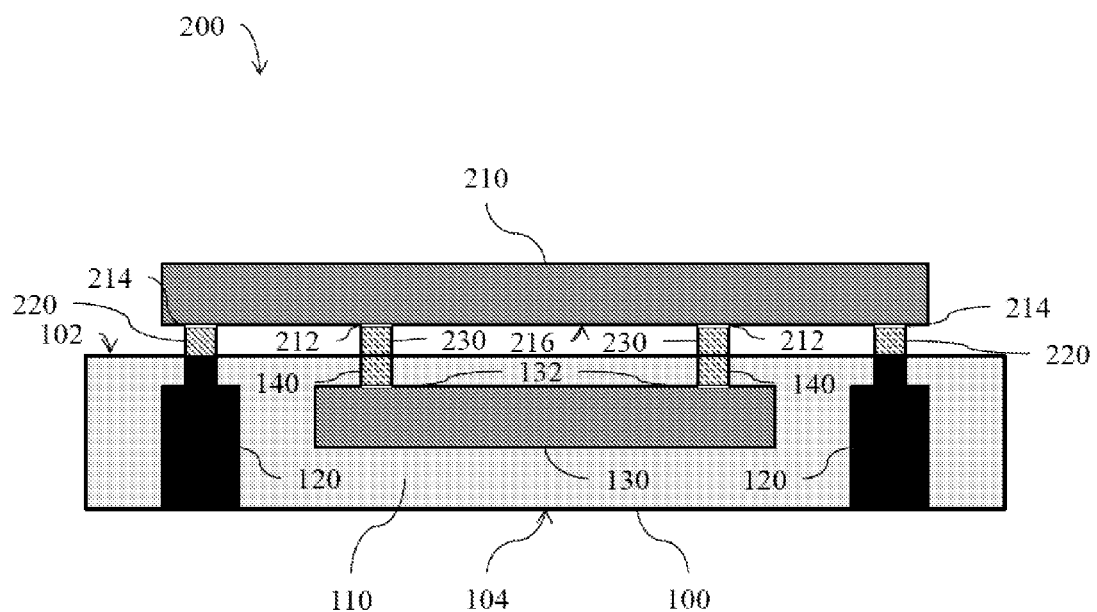
FIG. 2 illustrates a cross-section side view of an assembled package including the semiconductor package in FIG. 1A.

An assembled semiconductor package 200 includes, among other components, the semiconductor package 100 of FIGS. 1A-1C, a second die 210, a second plurality of pillar bumps 220, and a third plurality of pillar bumps 230, as illustrated in FIG. 2. The second die 210 includes, among other components, a first plurality of exposed electrical contact surfaces 212 and a second plurality of exposed electrical contact surfaces 214, both of which are positioned on a first side 216 of the second die 210. The second plurality of pillar bumps 220 are bonded to first side 122 of the lead frame 120 and to the second plurality of exposed electrical contact surfaces 214 in order to provide electrical connections between the second die 210 and the second side of the semiconductor package 104. The third plurality of pillar bumps 230 are bonded to the first plurality of pillar bumps 140 and the first plurality of exposed electrical contact surfaces 212 to provide electrical connections between the second die 210 and the embedded die 130. In some implementations, the second die 210 is a microelectromechanical systems ("MEMS") die.

Figure 3A:
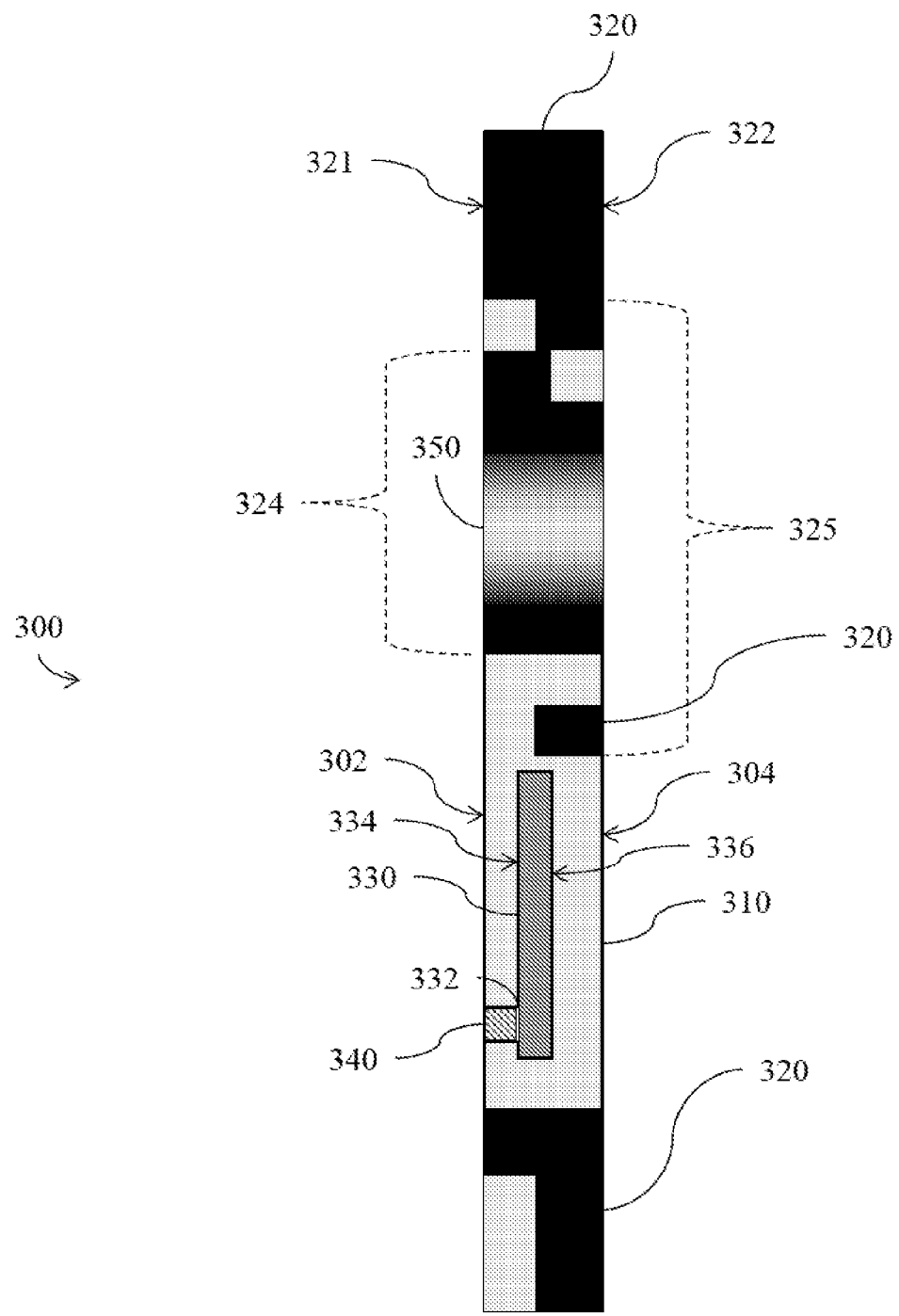
FIG. 3A illustrates a cross-section side view of a microphone package.

In some implementations, a microphone package 300 includes, among other components, a first side 302, a second side 304, a molded substrate 310, a lead frame 320, an embedded die 330, a first plurality of pillar bumps 340, and an acoustic port hole 350, as illustrated in the cross-section side view of FIG. 3A. The first side 302 of the microphone package 300 is opposite from the second side 304 of the microphone package 300.

Figure 3B:
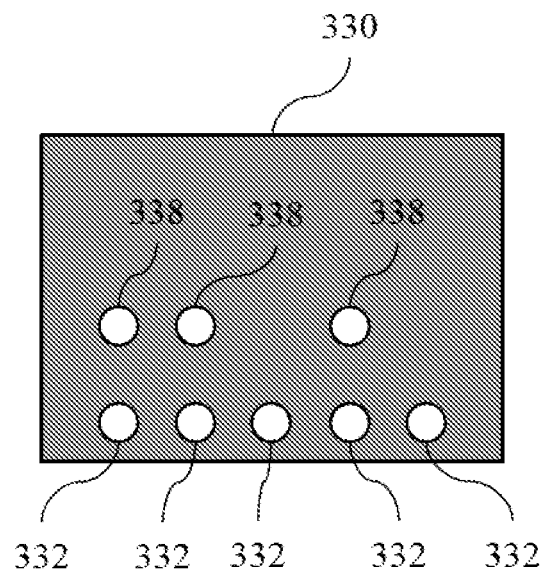
FIG. 3C illustrates a cross-section side view of the microphone package hi FIG. 3A.
FIG. 3D illustrates a top view of the microphone package in FIG. 3A.
FIG. 3E illustrates a bottom view of the microphone package in FIG. 3A.

The embedded die 330 includes a first plurality of exposed electrical contact surfaces 332 that is positioned on a first side 334 of the embedded die 330, and a second side 336, as illustrated in FIG. 3A. The second side 336 of the embedded die 330 is opposite from the first side 334 of the embedded die 330. The embedded die 330 also includes a second plurality of exposed electrical contact surfaces 338 that is positioned on the first side 334 of the embedded die 330, as illustrated in FIG. 3B. FIG. 3B is a side view of the first side 334 of the embedded die 330. In some implementations, the second plurality of exposed electrical contact surfaces 338 is positioned parallel to the first plurality of exposed electrical contacts surfaces 332, also as illustrated in FIG. 3B. In some implementations, the embedded die 330 further includes a third plurality of exposed electrical contact surfaces (not shown) that is positioned on the second side 336 of the embedded die 330.

Figure 3C:
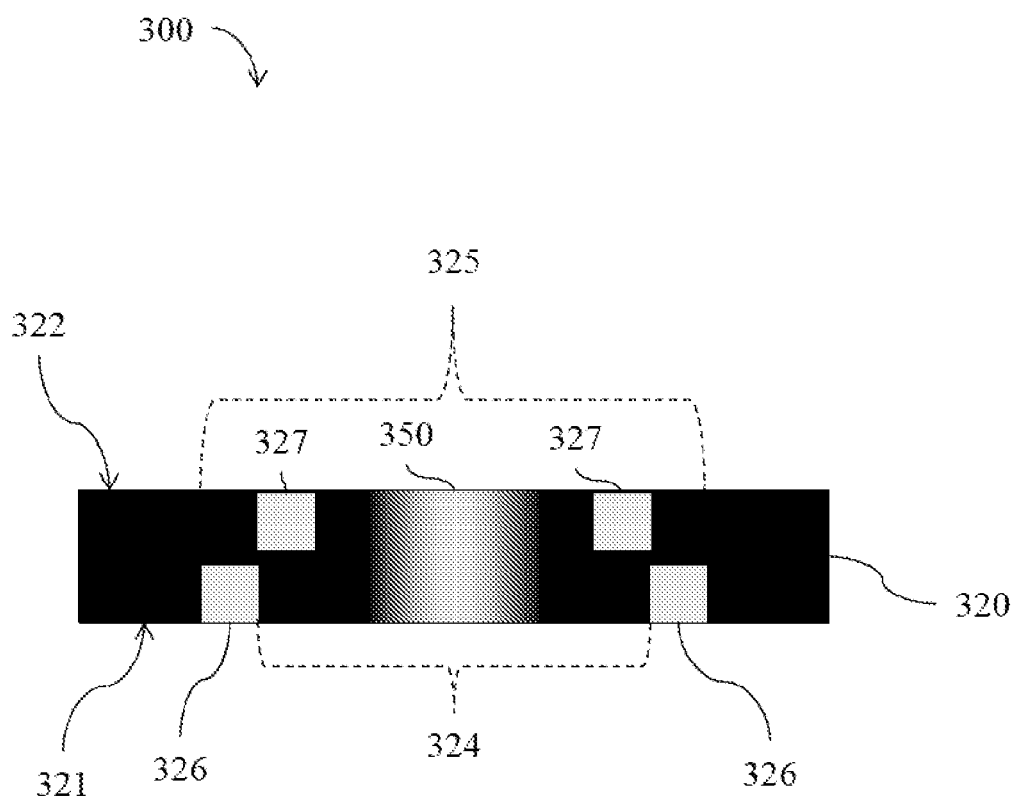

The lead frame 320 is half etched on a first side 321 and a second side 322 to form a port hole structure 324 and a seal ring structure 325, as illustrated in the cross-section side view of FIG. 3C. The second side 322 of the lead frame 320 is opposite from the first side 321 of the lead frame 320. Half etching the first side 321 and the second side 322 of the lead frame 320 allow the molded substrate 310 to form a solder dam between the seal ring structure 325 to allow for reflow solder attach without risk of clogging the port hole 350 due to solder wetting of the port hole structure 324. In some implementations, other shapes besides a circle are used for the port hole structure 324.

Etching is used in micro-fabrication to chemically remove layers from the surface of a lead frame during manufacturing. Through etching includes removing a portion of the lead frame completely through from one side to an opposite side. Half etching (i.e., partial etching) includes removing a portion of the lead frame, not completely through, from one side to the opposite side. FIG. 3C illustrates cavities 326, 327 created by half etching the first side 321 and the second side 322 of the lead frame 320, respectively. Different patterns are formed on opposite sides of the lead frame by half etching each side. Further, filling the cavities, formed by half etching both sides of the lead frame, with the molded substrate forms defined patterns in the molded substrate.

Figure 3D:
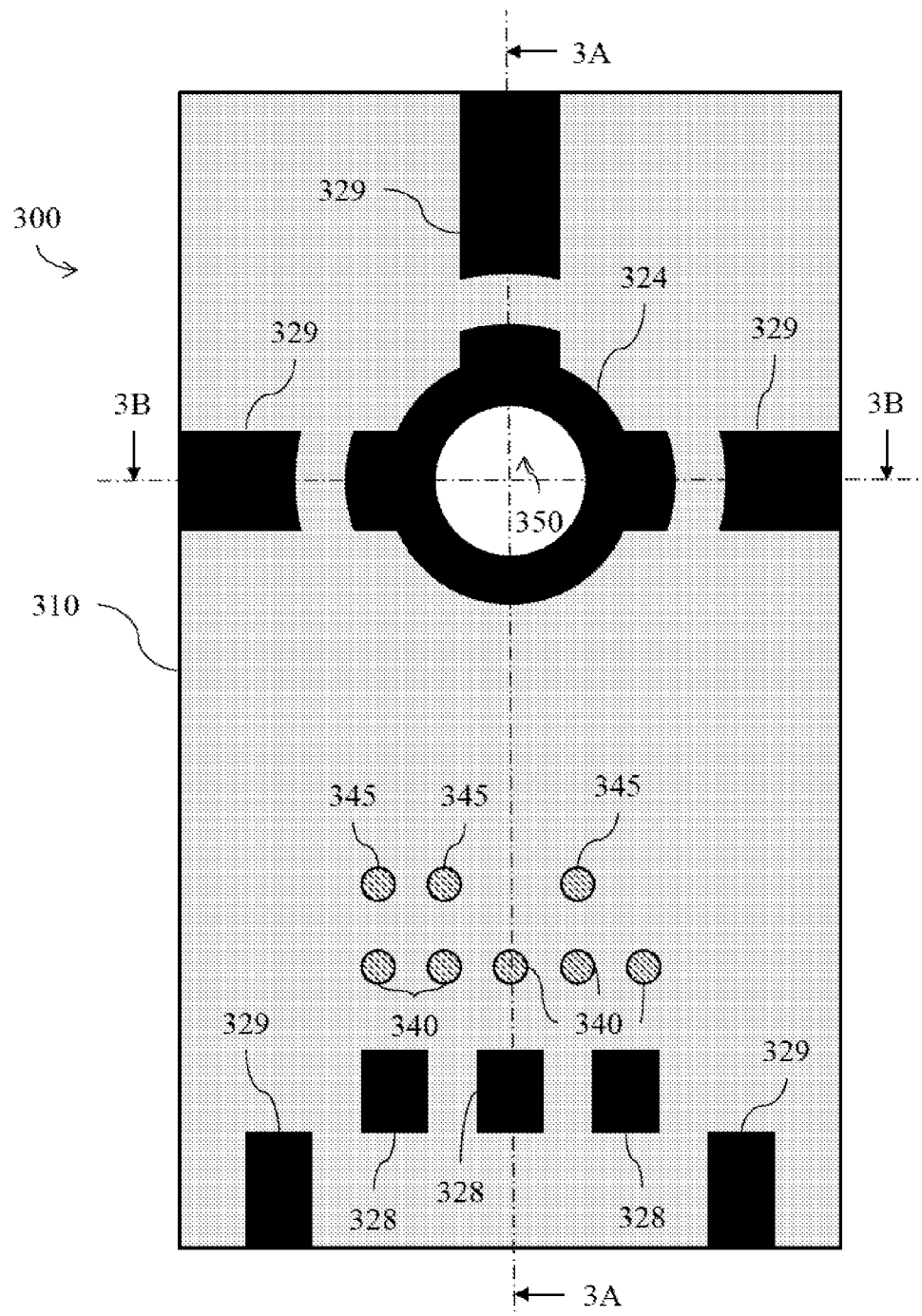
Figure 3E:
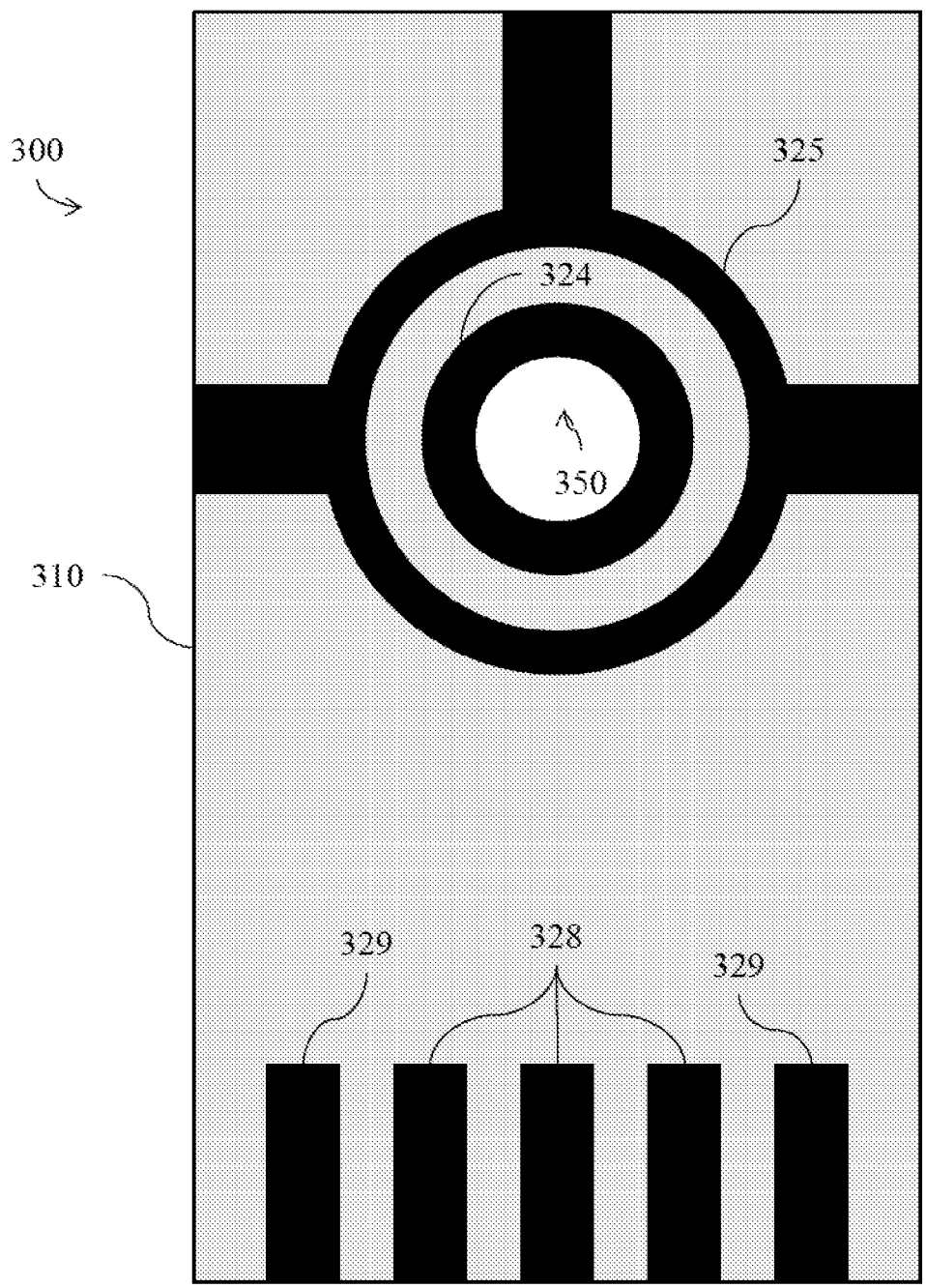

The lead frame 320 further includes a first plurality of electrical contact surfaces 328 and a second plurality of electrical contact surfaces 329, as illustrated in FIGS. 3D and 3E. FIGS. 3D and 3E are side views of the first side 302 and the second side 304 of the microphone package 300, respectively. The first plurality of electrical contact surfaces 328 provides a connection points between the lead frame 320 and the first plurality of pillar bumps 340. This allows for a plurality of electrical connection between the lead frame 320 and the embedded die 330. The second plurality of electrical contact surfaces 329 provides electrical contact points to connect a metal lid (not shown) to the molded substrate 310.

Figure 4:
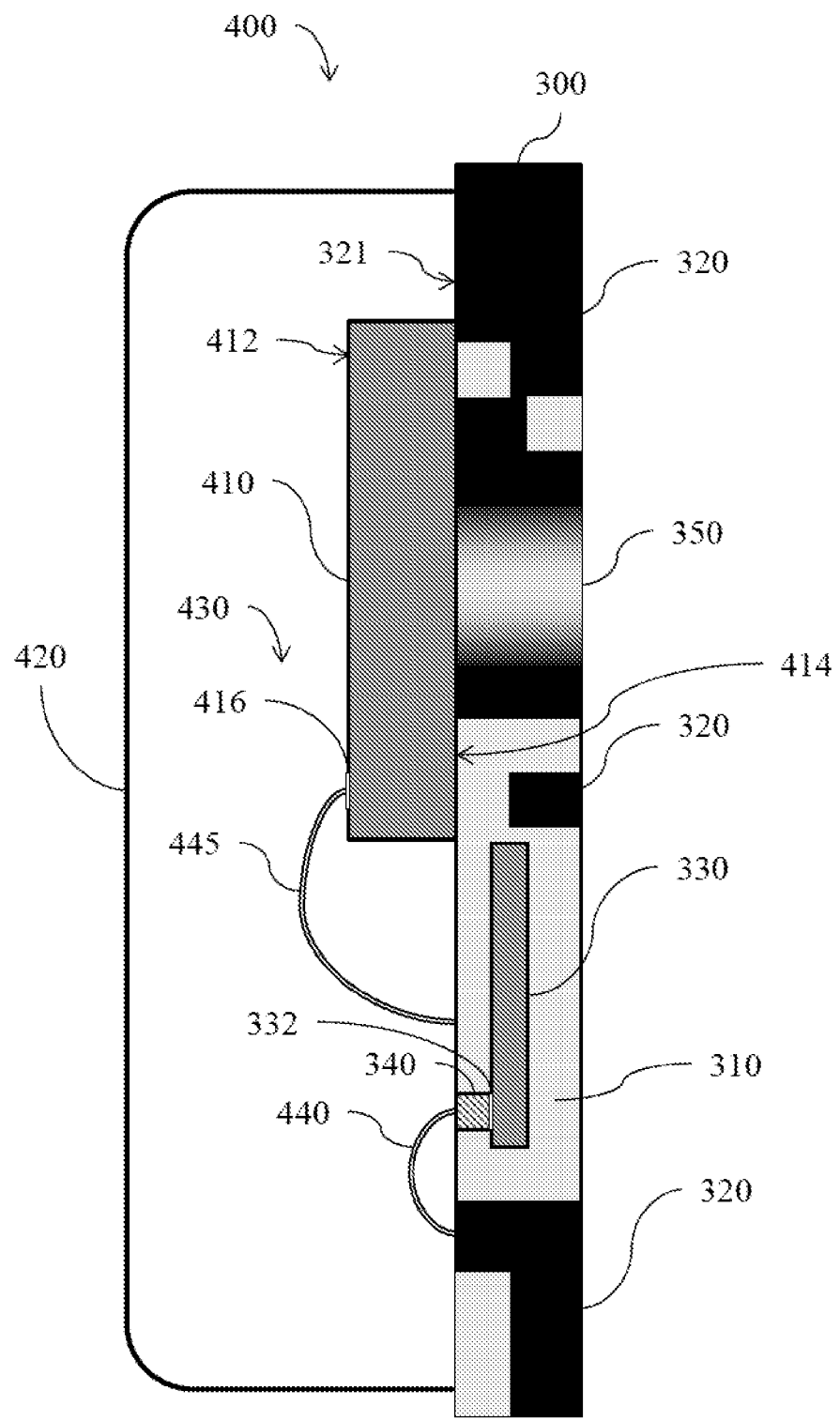
FIG. 4 illustrates an assembled microphone package including, the microphone package in FIG. 3A.

An assembled microphone package 400 includes, among other components, the microphone package 300 of FIGS. 3A-3E, a MEMS die 410, a metal lid 420, a back volume 430, a first plurality of wires 440, and a second plurality of wires 445, as illustrated in the cross-section side view of FIG. 4. The MEMS die 410 includes, among other components, a first side 412, a second side 414, and a plurality of exposed electrical contact surfaces 416. The second side 414 of the MEMS die 410 is opposite from the first side 412 of the MEMS die 410. The plurality of exposed electrical contact surfaces 416 is positioned on the first side 412 of the MEMS die 410. The second side 414 of the MEMS die 410 is bonded to the first side 321 of the lead frame 320. The metal lid 420 is bonded to the second plurality of contact surfaces 328 of the lead frame 320. In some implementations, ground fingers are exposed along the edge of the microphone package 400 to form an electro-magnetic interference faraday cage between the molded substrate 310 and the metal lid 420. This cage completes the back volume 430 of the assembled microphone package 400. In some implementations, connection of the metal lid 420 to the molded substrate 310 is made with a conductive material such as silver filled epoxy for proper electrical grounding between the metal lid 420 and the molded substrate 310.

The first plurality of wires 440 provides electrical connections between the first plurality of pillar bumps 340 and the lead frame 320. This allows for electrical connections between the embedded die 330 and the lead frame 320. The second plurality of wires 445 provides electrical connections between the second plurality of pillar bumps 345 and the exposed electrical contact surfaces 416 of the MEMS die 410. This allows for electrical connections between the embedded die 330 and the MEMS die 410.

Figure 5:
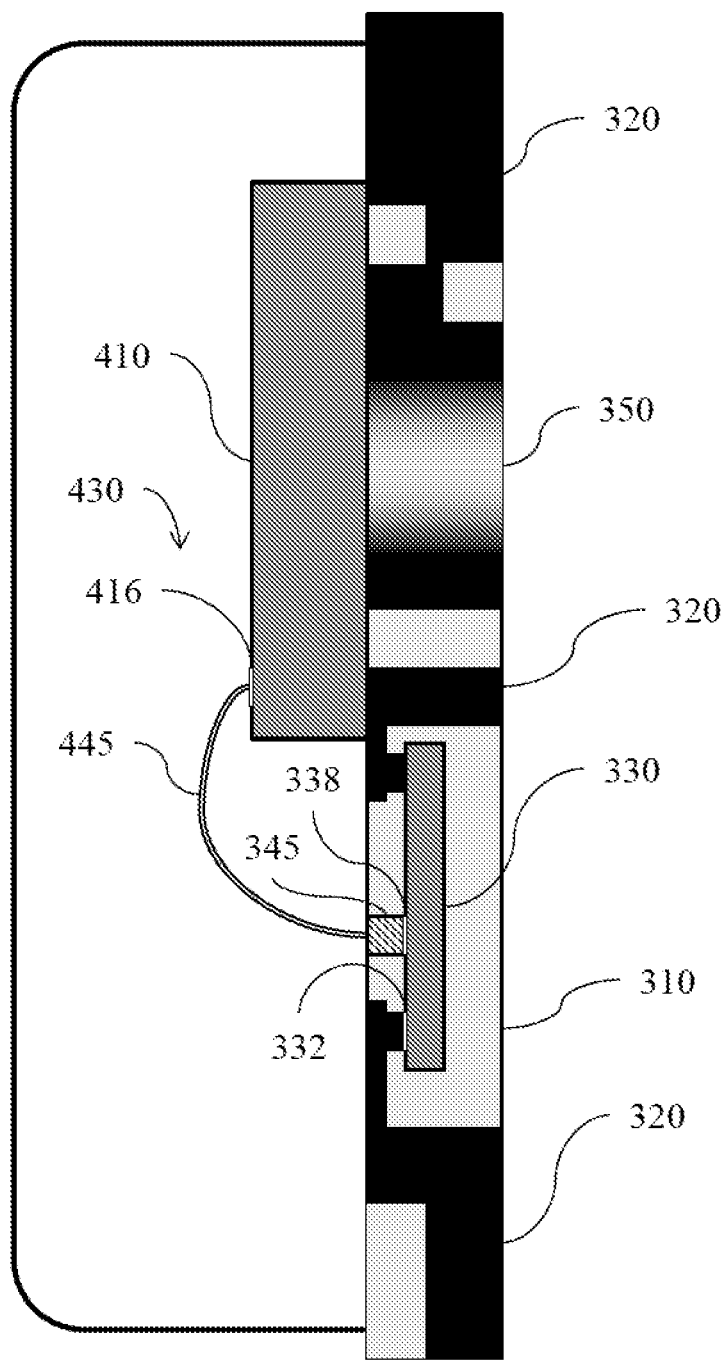
FIG. 5 illustrates an assembled microphone package.

In some implementations, the embedded die 330 is bonded directly to the lead frame 320, as illustrated in the cross section side view of FIG. 5. Bonding the embedded die 330 directly to the lead frame 320 (i.e. flip chip bonding) creates a structure that is more mechanically rigid but still possesses the same electrical qualities as the other implementations discussed above.

For clarity, the figures do not show the application of underfill or over mold. However, one or both may be used in conjunction with the implementations discussed above in order to provide environmental or mechanical protection to the components mounted on the first side of the molded substrate.

What is claimed is:

1. A semiconductor package, comprising:
    a first side;
    a second side opposite the first side;
    a molded substrate;
    a die embedded in the molded substrate, the die includes a first electrical contact surface positioned on a first side of the die;
    a lead frame embedded in the molded substrate and positioned between the first side and the second side of the semiconductor package to provide a first electrical connection between the first side and the second side of the semiconductor package, wherein the lead frame includes a half etched first side and a half etched second side forming a port hole structure and a seal ring structure, wherein the half etched first side is substantially parallel to the first side of the semiconductor package, and wherein the half etched second side is substantially parallel to the second side of the semiconductor package;
    a first pillar bump that is
        embedded in the molded substrate,
        positioned between the first electrical contact surface and the first side of the semiconductor package to provide a second electrical connection between the first electrical contact surface and the first side of the semiconductor package, and
        spaced apart from the lead frame.

2. The semiconductor package of claim 1, wherein the die further includes at least one component selected from a group comprising an application specific integrated circuit and a silicon die.

3. The semiconductor package of claim 1, wherein the first electrical contact surface is directly coupled to the half etched first side of the lead frame.

4. The semiconductor package of claim 1, further comprising
    a second die, the second die includes a second electrical contact surface positioned on a first side of the second die and a third electrical contact surface positioned on the first side of the second die;
    a second pillar bump positioned between the second electrical contact surface and the first pillar bump to provide a third electrical connection between the second electrical contact surface and the first pillar bump; and
    a third pillar bump positioned between the third electrical contact surface and the half etched first side of the lead frame to provide a fourth electrical connection between the third electrical contact surface and the half etched first side of the lead frame.

5. The semiconductor package of claim 1, wherein the die further includes a second electrical contact surface positioned on the first side of the die and parallel to the first electrical contact surface, and wherein the semiconductor package further comprising
    a second pillar bump, the second pillar bump
        is embedded in the molded substrate,
        is positioned between the second electrical contact surface and the first side of the semiconductor package to provide a third electrical connection between the second electrical contact surface and the first side of the semiconductor package,
        is spaced apart from the lead frame; and
    a first wire coupled to the second pillar bump and the half etched first side of the lead frame.

6. The semiconductor package of claim 1, further comprising
    a MEMS die, the MEMS die includes a first side, a second side opposite the first side, and a third electrical contact surface positioned on the first side of the MEMS die, and the second side of the MEMS die is coupled to the half etched first side of the lead frame; and
    a first wire coupled to the first pillar bump and the third electrical contact surface.

7. A method of manufacturing a semiconductor package, the semiconductor package including a first side and a second side opposite the first side, the method comprising:
    providing a molded substrate;
    embedding a die into the molded substrate, the die includes a first electrical contact surface positioned on a first side of the die;
    embedding a lead frame into the molded substrate, the lead frame positioned between the first side and the second side of the semiconductor package to provide a first electrical connection between the first side and the second side of the semiconductor package;
    half etching a first side of the lead frame and a second side of the lead frame to form a port hole structure and a seal ring structure, wherein the first side of the lead frame is substantially parallel to the first side of the semiconductor package, and wherein the second side of the lead frame is substantially parallel to the second side of the semiconductor package;
    embedding a first pillar bump into the molded substrate; and
    positioning the first pillar bump between the first electrical contact surface of the die and the first side of the semiconductor package to provide a second electrical connection between the first electrical contact surface and the first side of the semiconductor package, and spaced apart from the lead frame.

8. The method of claim 7, wherein the die further includes at least one component selected from a group comprising an application specific integrated circuit and a silicon die.

9. The method of claim 7, further comprising directly coupling the first electrical contact surface to the half etched first side of the lead frame.

10. The method of claim 7, further comprising
    coupling a second pillar bump to the first pillar bump;
    coupling the second pillar bump to a second electrical contact surface to provide a third electrical connection between the second pillar bump and the second electrical contact surface, the second electrical contact surface is positioned on a first side of a second die;

coupling a third pillar bump to the second die; and
coupling the third pillar bump to the half etched first side of the lead frame.

11. The method of claim 7, wherein the die further includes a second electrical contact surface positioned on the first side of the die and parallel to the first electrical contact surface, and the method further comprising
  embedding a second pillar bump into the molded substrate;
  positioning the second pillar bump between the second electrical contact surface and the first side of the semiconductor package to provide a third electrical connection between the second electrical contact surface and the first side of the semiconductor package, and spaced apart from the lead frame;
  coupling a first wire to the second pillar bump; and
  coupling the first wire to the half etched first side of the lead frame.

12. The method of claim 7, further comprising
  coupling a first wire to the first pillar bump;
  coupling the first wire to a third electrical contact surface, the third electrical contact surface is positioned on a first side of a MEMS die; and
  coupling a second side of the MEMS die to the half etched first side of the lead frame, the second side of the MEMS die is opposite the first side of the MEMS die.

\* \* \* \* \*